US012205976B2

United States Patent
Lou et al.

(10) Patent No.: US 12,205,976 B2
(45) Date of Patent: Jan. 21, 2025

(54) DISPLAY PANEL AND DISPLAY APPARATUS

(71) Applicant: KunShan Go-Visionox Opto-Electronics Co., Ltd, Jiangsu (CN)

(72) Inventors: Junhui Lou, Kunshan (CN); Lu Zhang, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 750 days.

(21) Appl. No.: 17/470,223

(22) Filed: Sep. 9, 2021

(65) Prior Publication Data

US 2021/0408111 A1    Dec. 30, 2021

Related U.S. Application Data

(63) Continuation of application No. PCT/CN2020/085133, filed on Apr. 16, 2020.

(30) Foreign Application Priority Data

Aug. 30, 2019    (CN) .......................... 201921438744.6

(51) Int. Cl.
*H01L 27/15* (2006.01)
*G09G 3/20* (2006.01)
(Continued)

(52) U.S. Cl.
CPC .............. *H01L 27/156* (2013.01); *G09G 3/20* (2013.01); *H01L 33/38* (2013.01); *H01L 33/405* (2013.01); *H01L 33/62* (2013.01)

(58) Field of Classification Search
CPC ...... H01L 27/156; H01L 33/38; H01L 33/405; H01L 33/62; G09G 3/20
See application file for complete search history.

(56) References Cited

U.S. PATENT DOCUMENTS

| 2009/0066893 A1* | 3/2009 | Tsai .................... G02F 1/13624 349/147 |
| 2019/0130822 A1* | 5/2019 | Jung .................... G09G 3/3208 |

(Continued)

FOREIGN PATENT DOCUMENTS

| CN | 107610635 A | 1/2018 |
| CN | 109192759 A | 1/2019 |

(Continued)

OTHER PUBLICATIONS

International Search Report with English translation and Written Opinion of the International Searching Authority issued on Jul. 22, 2020 in corresponding International application No. PCT/CN2020/085133; 14 pages.

*Primary Examiner* — Ariel A Balaoing
(74) *Attorney, Agent, or Firm* — Maier & Maier, PLLC

(57) ABSTRACT

A display panel and a display apparatus. The display panel includes a main display area, a first secondary display area, a second secondary display area and a transition display area, a transmittance of the first secondary display area is greater than a transmittance of the main display area, and the display panel includes: a first pixel unit located in the first secondary display area and including a first sub-pixel; a second pixel unit located in the second secondary display area and including a second sub-pixel; and a third pixel unit located in the transition display area and including a third sub-pixel, in which at least two of the first sub-pixel, the second sub-pixel and the third sub-pixel of a first color have a first size.

20 Claims, 4 Drawing Sheets

(51) Int. Cl.
    *H01L 33/38*     (2010.01)
    *H01L 33/40*     (2010.01)
    *H01L 33/62*     (2010.01)

(56) References Cited

U.S. PATENT DOCUMENTS

| | | | |
|---|---|---|---|
| 2020/0098332 A1* | 3/2020 | Zhang | G09G 5/003 |
| 2020/0161400 A1* | 5/2020 | Ka | H10K 59/1213 |
| 2020/0258953 A1* | 8/2020 | Bae | H10K 59/60 |
| 2020/0335023 A1* | 10/2020 | Yen | G09G 5/14 |
| 2020/0380917 A1* | 12/2020 | Zhu | H10K 59/1213 |
| 2021/0248945 A1* | 8/2021 | Liu | H04N 23/57 |
| 2021/0327972 A1* | 10/2021 | Lou | G09G 3/3225 |
| 2021/0359080 A1* | 11/2021 | Xu | H10K 59/1213 |

FOREIGN PATENT DOCUMENTS

| | | |
|---|---|---|
| CN | 208607570 U | 3/2019 |
| CN | 109950288 A | 6/2019 |
| CN | 110061014 A | 7/2019 |
| CN | 209070895 U | 7/2019 |
| CN | 209265332 U | 8/2019 |
| CN | 110767720 A | 2/2020 |
| CN | 210120138 U | 2/2020 |

\* cited by examiner

DISPLAY PANEL AND DISPLAY APPARATUS

CROSS REFERENCE TO RELATED APPLICATION

The present application is a continuation of International Application No. PCT/CN2020/085133 filed on Apr. 16, 2020, which claims the benefit of priority to Chinese Patent Application No. 201921438744.6 filed on Aug. 30, 2019, both of which are incorporated herein by reference in their entireties.

TECHNICAL FIELD

The present application relates to the field of display, and particularly to a display panel and a display apparatus.

BACKGROUND

A high screen-to-body ratio is the latest development direction of a smart electronic product. To increase the screen-to-body ratio, various sensors on the front of the electronic product need to be integrated under a display panel. At present, components such as a fingerprint recognition component, a telephone receiver can already be well integrated under the display panel, but the integration of a front camera of the electronic product still cannot be solved well.

For the integration of the front camera, the current solutions are to dig grooves or punch holes on the display panel at the position corresponding to the camera, but this may cause the problem that the area of the display panel for digging grooves or punching holes cannot display information.

SUMMARY

The present application provides a display panel and a display apparatus.

In one aspect, embodiments of the present application provide a display panel including a main display area, a first secondary display area, a second secondary display area and a transition display area, wherein the first secondary display area, the second secondary display area and the transition display area are located at a same side of the main display area, the transition display area is located between the first secondary display area and the second secondary display area, a transmittance of the first secondary display area is greater than a transmittance of the main display area, and the display panel comprises: a first pixel unit located in the first secondary display area and comprising a first sub-pixel; a first pixel circuit located in the transition display area, electronically connected with the first sub-pixel and configured to drive the first sub-pixel for display; a second pixel unit located in the second secondary display area and comprising a second sub-pixel; and a third pixel unit located in the transition display area and comprising a third sub-pixel; wherein at least two of the first sub-pixel, the second sub-pixel and the third sub-pixel of a first color have a first size.

According to the display panel and the display apparatus of embodiments of the present application, the transmittance of the first secondary display area is greater than the transmittance of the main display area, such that a photosensitive component may be integrated on the rear of the first secondary display area of the display panel. An under-screen integration is achieved for the photosensitive component such as a camera, and moreover, the first secondary display area can display the image, thus the display area of the display panel is increased and a full-screen design is achieved for the display apparatus. The first pixel circuit is located in the transition display area, so the first secondary display area has more spaces to arrange a light-transmitting area, and the light-transmitting performance of the first secondary display area is improved.

At least two of the first sub-pixel, the second sub-pixel and the third sub-pixel of a same color have a same size, thus the display difference and the lifespan difference between at least two of the first secondary display area, the second secondary display area and the transition display area is reduced, and the uniformity of the display panel is improved.

In another aspect, embodiments of the present application provide a display apparatus including the display panel of any of the above embodiments.

BRIEF DESCRIPTION OF THE DRAWINGS

Other features, objects, and advantages of the present application will become more apparent by reading the following detailed description of non-limiting embodiments with reference to the accompanying drawings, in which the same or similar reference numerals represent the same or similar features. The accompanying drawings are not drawn to actual scale.

DETAILED DESCRIPTION

In a smart electronic apparatus such as a cell phone and a tablet computer, it is needed to integrate a photosensitive component such as a front camera, an infrared light sensor, and a proximity light sensor on the side where the display panel is arranged. In some embodiments, a light-transmitting display area may be arranged in the above electronic apparatus, and the photosensitive component is arranged under the light-transmitting display area. A full-screen display is achieved for the electronic apparatus while the photosensitive component is guaranteed to work normally.

In the display panel with the light-transmitting display area, since the device structure and the aperture ratio in the light-transmitting display area are often different than those in other non-light-transmitting display area of the display panel, the light-transmitting display area and the non-light-transmitting display area are different in the display and the lifespan.

In order to solve the above problems, embodiments of the present application provide a display panel and a display apparatus, which will be described below with reference to the accompanying drawings.

Embodiments of the present application provide a display panel, which may be an Organic Light Emitting Diode (OLED) display panel. The display panel of embodiments of the present application will be described in detail below with reference to the accompanying drawings.

Figure 1:
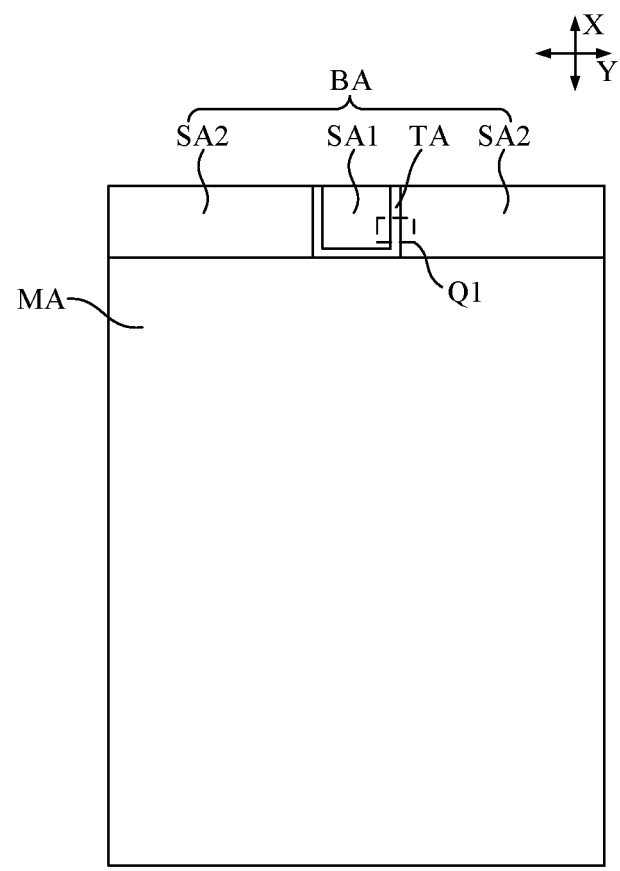
FIG. 1 is a top view of a display panel provided according to an embodiment of the present application.

FIG. 1 is a top view of a display panel provided according to an embodiment of the present application. The display panel 1000 includes a main display area MA, a first secondary display area SA1, a second secondary display area SA2 and a transition display area TA. The first secondary display area SA1, the second secondary display area SA2 and the transition display area TA are located at a same side of the main display area MA, the transition display area TA is located between the first secondary display area SA1 and the second secondary display area SA2.

Optionally, the first secondary display area SA1, the second secondary display area SA2 and the transition display area TA are collectively reused as a status bar display area BA. The status bar display area BA is arranged adjacent to the main display area MA in a first direction X, the status bar display area BA is in a strip shape extending along a second direction Y, and the second direction Y intersects the first direction X. Alternatively, the second direction Y is perpendicular to the first direction X. The transmittance of the first secondary display area SA1 is greater than the transmittance of the main display area MA.

In the present application, the status bar display area refers to the area for displaying the status bar in an image when the display panel displays the image. Preferably, the transmittance of the first secondary display area SA1 is greater than or equal to 15%. To ensure that the transmittance of the first secondary display area SA1 is greater than 15%, or even greater than 40%, or even a higher transmittance, the transmittance of at least part of functional films in the first secondary display area SA1 of the display panel 1000 in the embodiment is greater than 80%, and even the transmittance of at least part of the functional films is greater than 90%.

According to the display panel 1000 and the display apparatus of embodiments of the present application, the status bar display area BA includes the first secondary display area SA1 and the second secondary display area SA2, and the transmittance of the first secondary display area SA1 is greater than the transmittance of the main display area MA, such that the photosensitive component may be integrated on the rear of the first secondary display area SA1 of the display panel 1000. An under-screen integration is achieved for the photosensitive component such as a camera, and moreover, the first secondary display area SA1 can display the image, the display area of the display panel 1000 is increased and a full-screen design is achieved for the display apparatus.

Figure 2:
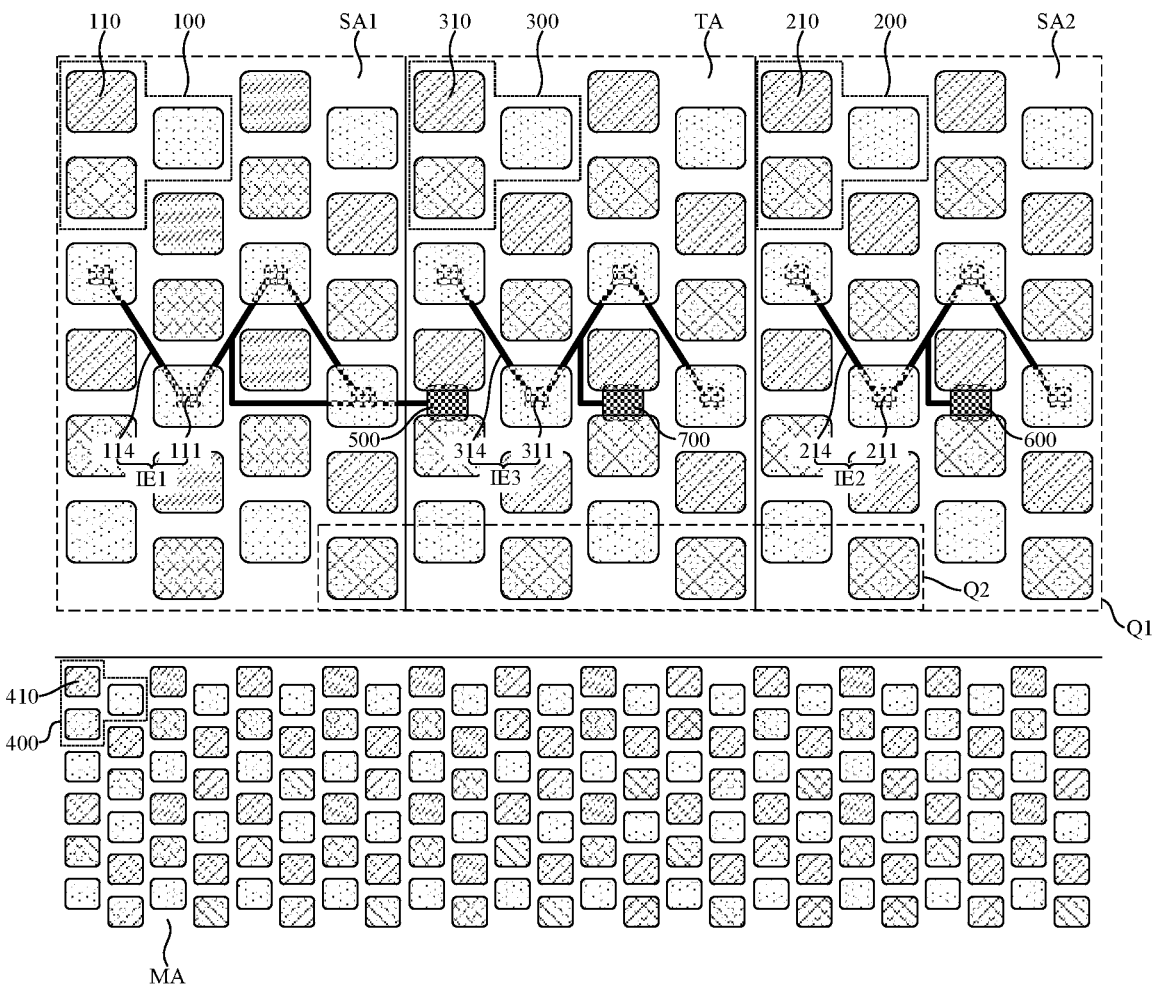
FIG. 2 shows a partial enlarged schematic diagram of the area Q1 in FIG. 1 and a partial enlarged schematic diagram of the main display area MA.

FIG. 2 shows a partial enlarged schematic diagram of the area Q1 in FIG. 1 and a partial enlarged schematic diagram of the main display area MA. The display panel 1000 includes a first pixel unit 100, a second pixel unit 200 and a third pixel unit 300. The first pixel unit 100 is located in the first secondary display area SA1 and includes a first sub-pixel 110. The second pixel unit 200 is located in the second secondary display area SA2 and includes a second sub-pixel 210. The third pixel unit 300 is located in the transition display area TA and includes a third sub-pixel 310.

The display panel 1000 further includes a first pixel circuit 500 located in the transition display area TA. The first pixel circuit 500 is electronically connected with the first sub-pixel 110 and configured to drive the first sub-pixel 110 for display. Since the first pixel circuit 500 configured to drive the first sub-pixel 110 is located in the transition display area TA, the first secondary display area SA1 has more spaces to arrange a light-transmitting area, and the light-transmitting performance of the first secondary display area SA1 is improved.

Optionally, the display panel 1000 further includes a fourth pixel unit 400 located in the main display area MA, and the fourth pixel unit 400 includes a fourth sub-pixel 410.

The first pixel unit 100 may include the first sub-pixels 110 of a variety of colors. Alternatively, each of the first pixel units 100 includes a red first sub-pixel, a green first sub-pixel, and a blue first sub-pixel. The color and number of the sub-pixels in the second pixel unit 200, the third pixel unit 300, and the fourth pixel unit 400 may respectively correspond to those of the first pixel unit 100. In addition, it should be noted that the above color and number of the sub-pixels in the first pixel unit 100 are merely examples, and alternatively, the color, number, and arrangement rule of the sub-pixels in the first pixel unit 100 may be adjusted.

Optionally, at least two of the first sub-pixel 110, the second sub-pixel 210 and the third sub-pixel 310 of a same color have a same size, thus the display difference and the lifespan difference between at least two of the first secondary display area SA1, the second secondary display area SA2 and the transition display area TA is reduced, and the uniformity of the display panel 1000 is improved.

In the present application, the size of a certain component refers to the area occupied by all the structures included (or designed) in the component on the display surface of the display panel 1000.

In the embodiment, the pixel unit density of the third pixel unit 300, the pixel unit density of the first pixel unit 100 and the pixel unit density of the second pixel unit 200 are equal to each other. The size of the third sub-pixel 310 is the same as the size of the first sub-pixel 110 of a same color as the third sub-pixel 310 and the size of the second sub-pixel 210 of the same color, thus the display difference and the lifespan difference between the first secondary display area SA1, the second secondary display area SA2 and the transition display area TA is reduced, and the uniformity of the status bar display area BA is improved.

In the above embodiments, the first sub-pixel 110, the second sub-pixel 210 and the third sub-pixel 310 of a same color have a same size. Alternatively, it may be the case that two of the first sub-pixel 110, the second sub-pixel 210 and the third sub-pixel 310 of a same color have a same size. For example, the first sub-pixel 110 and the third sub-pixel 310 of a same color have a same size, or the second sub-pixel 210 and the third sub-pixel 310 of a same color have a same size.

Figure 3:
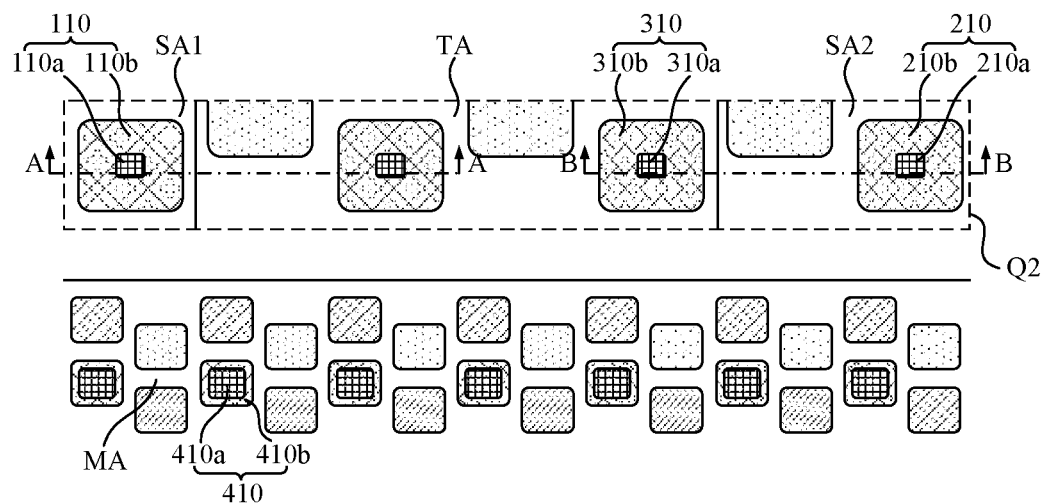
FIG. 3 shows a partial enlarged schematic diagram of the area Q2 in FIG. 2 and a partial enlarged schematic diagram of the main display area MA.

FIG. 3 shows a partial enlarged schematic diagram of the area Q2 in FIG. 2 and a partial enlarged schematic diagram of the main display area MA. FIG. 3 schematically shows a part of the detailed structures of the first sub-pixel 110, the second sub-pixel 210, the third sub-pixel 310 and the fourth sub-pixel 410 of a same color, and the first sub-pixel 110, the second sub-pixel 210, the third sub-pixel 310 and the fourth sub-pixel 410 of other colors may have a similar structure.

Optionally, the first sub-pixel 110 includes a first light-emitting area 110a and a first non-light-emitting area 110b, and the first non-light-emitting area 110b is arranged around at least part of a periphery of the first light-emitting area 110a. The second sub-pixel 210 includes a second light-emitting area 210a and a second non-light-emitting area 210b, and the second non-light-emitting area 210b is arranged around at least part of a periphery of the second light-emitting area 210a. The third sub-pixel 310 includes a third light-emitting area 310a and a third non-light-emitting area 310b, and the third non-light-emitting area 310b is arranged around at least part of a periphery of the third light-emitting area 310a. The fourth sub-pixel 410 includes a fourth light-emitting area 410a and a fourth non-light-emitting area 410b, and the fourth non-light-emitting area 410b is arranged around at least part of a periphery of the fourth light-emitting area 410a.

Optionally, at least two of the first light-emitting area 110a, the second light-emitting area 210a and the third light-emitting area 310a respectively corresponding to the first sub-pixel 110, the second sub-pixel 210 and the third sub-pixel 310 of a same color have a same size and are smaller than the fourth light-emitting area 410a of the fourth sub-pixel 410 of the same color, so all of the light-emitting areas of the sub-pixels of at least two of the first secondary display area SA1, the second secondary display area SA2 and the transition display area TA are smaller than the light-emitting areas of the sub-pixels of the same color in the main display area MA, and the display effect and the lifespan of the at least two of the first secondary display area SA1, the second secondary display area SA2 and the transition display area TA tend to be consistent.

In the embodiment, the size of the third light-emitting area 310a of the third sub-pixel 310 is equal to each of the size of the first light-emitting area 110a of the first sub-pixel 110 of a same color and the size of the second light-emitting area 210a of the second sub-pixel 210 of the same color, and is smaller than the size of the fourth light-emitting area 410a of the fourth sub-pixel 410 of the same color.

According to the display panel 1000 of the above embodiments, all of the light-emitting areas of the sub-pixels in the entire status bar display area BA are smaller than the light-emitting areas of the sub-pixels of a same color in the main display area MA, and the display effect and the lifespan of the entire status bar display area BA tend to be consistent.

Optionally, the transmittance of the first non-light-emitting area 110b is greater than the transmittance of the first light-emitting area 110a, such that light can pass through the first non-light-emitting area 110b, and a light transmittance is achieved for the first secondary display area SAL The display panel 1000 may include a plurality of the first pixel units 100, and each of the first pixel units 100 may include a plurality of the first sub-pixels 110, and thus each of the first pixel units 100 may include a plurality of the first light-emitting areas 110a. A ratio of a total area of the plurality of the first light-emitting areas 110a in each of the first pixel units 100 to an area of the first pixel unit 100 is in a range of 0.02 to 0.25. Preferably, the ratio of the total area of the plurality of the first light-emitting areas 110a in each of the first pixel units 100 to the area of the first pixel unit 100 is in a range of 0.05 to 0.12, such that the transmittance and the lifespan of the structure of the first pixel unit 100 can be balanced, and a high transmittance is obtained on the premise of a sufficient lifespan.

Optionally, at least two of the first pixel unit 100, the second pixel unit 200 and the third pixel unit 300 have a same arrangement rule, thus the display uniformity of the display panel is further improved.

Optionally, the shape of the third sub-pixel 310 is the same as the shape of the first sub-pixel 110 of a same color and the shape of the second sub-pixel 210 of the same color, thus the uniformity of the status bar display area BA is further improved.

Optionally, all of the first sub-pixel 110, the second sub-pixel 210 and the third sub-pixel 310 are organic light-emitting diode sub-pixels.

Figure 4:
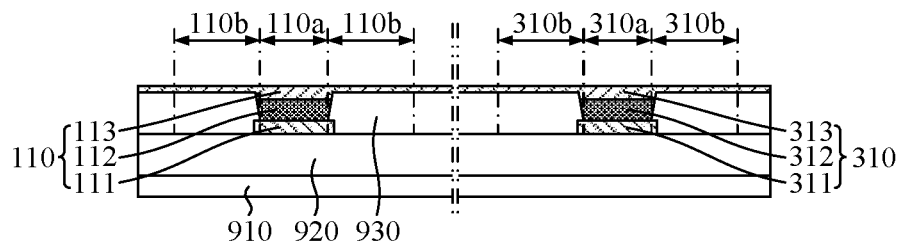
FIG. 4 is a cross-sectional view taken along the line A-A in FIG. 3.
Figure 5:
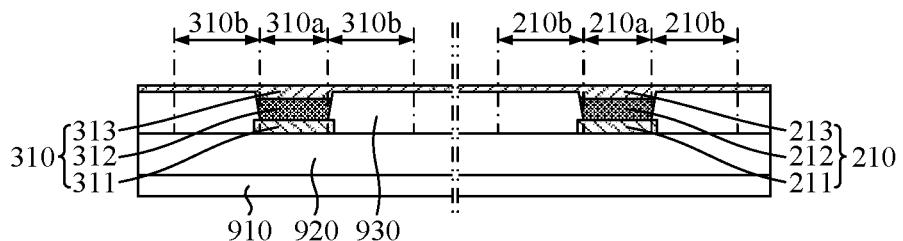
FIG. 5 is a cross-sectional view taken along the line B-B in FIG. 3.

FIG. 4 is a cross-sectional view taken along the line A-A in FIG. 3, and FIG. 5 is a cross-sectional view taken along the line B-B in FIG. 3. Optionally, the display panel 1000 includes a substrate 910, a device layer 920 located on the substrate 910, and a pixel defining layer 930 located on the device layer 920. The substrate 910 may be made of a light-transmitting material such as glass, Polyimide (PI). The device layer 920 may include pixel circuits for driving each of the sub-pixels for display, and the device layer 920 may be configured as a transparent layer structure. The pixel defining layer 930 may include pixel openings for accommodating the light-emitting structures of each of the sub-pixels.

Optionally, the first sub-pixel 110 includes a first electrode 111, a first light-emitting structure 112 located on the first electrode 111, and a second electrode 113 located on the first light-emitting structure 112. The second sub-pixel 210 includes a third electrode 211, a second light-emitting structure 212 located on the third electrode 211, and a fourth electrode 213 located on the second light-emitting structure 212. The third sub-pixel 310 includes a fifth electrode 311, a third light-emitting structure 312 located on the fifth electrode 311, and a sixth electrode 313 located on the third light-emitting structure 312. Herein, the first electrode 111, the third electrode 211 and the fifth electrode 311 are one of an anode and a cathode, and the second electrode 113, the fourth electrode 213 and the sixth electrode 313 are the other of the anode and the cathode.

Optionally, the first electrode 111, the third electrode 211 and the fifth electrode 311 are anodes and may be made of a transparent conductive material, or may be made of a material which can reflect light. For example, all of the first electrode 111, the third electrode 211 and the fifth electrode 311 are reflective electrodes.

Optionally, the first electrode 111 is an electrode structure including a reflective layer, for example, an electrode structure including two light-transmitting conductive layers and a reflective layer sandwiched between the two light-transmitting conductive layers, in which the light-transmitting conductive layers may be indium tin oxide (ITO), indium zinc oxide, etc., and the reflective layer may be a metal layer, for example, made of silver. The second electrode 113 may be a light-transmitting conductive layer, for example, a magnesium-silver alloy with a high transmittance.

Optionally, the first light-emitting structure 112 includes an OLED light-emitting layer. According to the design requirement of the first light-emitting structure 112, it may also include at least one of a hole injection layer, a hole transport layer, an electron injection layer, or an electron transport layer.

Optionally, an orthographic projection of the first electrode 111 on the substrate 910 includes one first graphic unit or two or more first graphic units jointed together, and the first graphic unit includes at least one selected from a group including a round shape, an oval shape, a dumb-bell shape, a gourd shape and a rectangle shape. Through configuring the shape of the first electrode 111 as described above, the light diffraction phenomenon of the first secondary display area SA1 can be reduced. Optionally, an orthographic projection of the first light-emitting structure 112 on the substrate 910 may include one second graphic unit or two or more second graphic units jointed together, and the second graphic unit includes at least one selected from a group including a round shape, an oval shape, a dumb-bell shape, a gourd shape and a rectangle shape. Through configuring the shape of the first light-emitting structure 112 as described above, the light diffraction phenomenon of the first secondary display area SA1 can be reduced.

Optionally, at least two of the first electrode 111, the third electrode 211 and the fifth electrode 311 respectively corresponding to the first sub-pixel 110, the second sub-pixel 210 and the third sub-pixel 310 of a same color have a same shape, a same size and a same layer structure. At least two of the first light-emitting structure 112, the second light-emitting structure 212 and the third light-emitting structure 312 respectively corresponding to the first sub-pixel 110, the second sub-pixel 210 and the third sub-pixel 310 of a same color have a same shape, a same size and a same layer structure. At least two of the second electrode 113, the fourth electrode 213 and the sixth electrode 313 respectively corresponding to the first sub-pixel 110, the second sub-pixel 210 and the third sub-pixel 310 of a same color have a same shape, a same size and a same layer structure.

In the embodiment, the first electrode 111, the third electrode 211 and the fifth electrode 311 respectively corresponding to the first sub-pixel 110, the second sub-pixel 210 and the third sub-pixel 310 of a same color have a same shape, a same size and a same layer structure. The first light-emitting structure 112, the second light-emitting structure 212 and the third light-emitting structure 312 respectively corresponding to the first sub-pixel 110, the second sub-pixel 210 and the third sub-pixel 310 of a same color have a same shape, a same size and a same layer structure. The second electrode 113, the fourth electrode 213 and the sixth electrode 313 respectively corresponding to the first sub-pixel 110, the second sub-pixel 210 and the third sub-pixel 310 of a same color have a same shape, a same size and a same layer structure.

According to the display panel 1000 of the above embodiments of the present application, through corresponding the size and/or shape and/or the anode structure and/or the cathode structure and/or the light-emitting structure of the first sub-pixel 110 of the first secondary display area SA1 to those of the second sub-pixel 210 of the second secondary display area SA2, and configuring the size and/or shape and/or the anode structure and/or the cathode structure and/or the light-emitting structure of the first sub-pixel 110 of the first secondary display area SA1 the same as those of the third sub-pixel 310 of the transition display area TA, the display difference and the lifespan difference between the first secondary display area SA1 with a high transmittance and the transition display area TA and the second secondary display area SA2 with a low transmittance can be significantly reduced; thereby the uniformity of the status bar display area BA is improved.

Since the status bar display area BA displays different types of content from the main display area MA in most of the application scenarios and most of the time periods, and most area of the status bar display area BA is used to display black in most time, thus the display difference between the status bar display area BA and the main display area MA hardly appear. Therefore, the display uniformity of the status bar display area BA itself in the display panel according to the above embodiments is relatively high, so the overall display effect of the display panel 1000 is more coordinated.

Still referring to FIG. 2, optionally, the first electrodes 111 of at least two adjacent first sub-pixels 110 of a same color are interconnected to form a first interconnected electrode IE1, the third electrodes 211 of at least two adjacent second sub-pixels 210 of a same color are interconnected to form a second interconnected electrode IE2, and the fifth electrodes 311 of at least two adjacent third sub-pixels 310 of a same color are interconnected to form a third interconnected electrode IE3. FIG. 2 schematically shows the structure of one first interconnected electrode IE1, the structure of one second interconnected electrode IE2, and the structure of one third interconnected electrode IE3. Alternatively, the remaining first sub-pixels 110 may be interconnected to form the first interconnected electrode IE1 through a similar rule, or the remaining second sub-pixels 210 may be interconnected to form the second interconnected electrode IE2 through a similar rule, or the remaining third sub-pixels 310 may be interconnected to form the third interconnected electrode IE3 through a similar rule.

Optionally, the first electrodes 111 of the adjacent first sub-pixels 110 of a same color are electrically connected by a first interconnecting conductor 114, and every predetermined number of the first electrodes 111 are interconnected by this first interconnecting conductor 114 to form the above first interconnected electrode IE1.

Optionally, the third electrodes 211 of the adjacent second sub-pixels 210 of a same color are electrically connected by a second interconnecting conductor 214, and every predetermined number of the third electrodes 211 are interconnected by this second interconnecting conductor 214 to form the above second interconnected electrode IE2.

Optionally, the fifth electrodes 311 of the adjacent third sub-pixels 310 of a same color are electrically connected by a third interconnecting conductor 314, and every predetermined number of the fifth electrodes 311 are interconnected by this third interconnecting conductor 314 to form the above third interconnected electrode IE3.

By interconnecting the first electrodes 111 of at least two adjacent first sub-pixels 110 of a same color to form the first interconnected electrode IE1, the wiring of the first secondary display area SA1 with a high transmittance can be reduced, and the light-transmitting performance of the first secondary display area SA1 is improved.

Optionally, at least two of the first interconnected electrode IE1, the second interconnected electrode IE2 and the third interconnected electrode IE3 respectively corresponding to the first sub-pixel 110, the second sub-pixel 210 and the third sub-pixel 310 of a same color have a same shape, so the display effect and the lifespan of at least two of the first secondary display area SA1, the second secondary display area SA2 and the transition display area TA tend to be consistent.

Alternatively, the first interconnected electrode IE1, the second interconnected electrode IE2 and the third interconnected electrode IE3 respectively corresponding to the first sub-pixel 110, the second sub-pixel 210 and the third sub-pixel 310 of a same color have a same shape, thus the display effect and the lifespan of the first secondary display area SA1, the second secondary display area SA2 and the transition display area TA are further ensured to tend to be consistent.

Optionally, the display panel 1000 further includes a second pixel circuit 600 and a third pixel circuit 700. Herein, the second pixel circuit 600 is located in the second secondary display area SA2, electronically connected with the second sub-pixel 210 and configured to drive the second sub-pixel 210 for display. The third pixel circuit 700 is electronically connected with the third sub-pixel 310 and configured to drive the third sub-pixel 310 for display, and the third pixel circuit 700 may be located in the transition display area TA.

Optionally, at least two of the first pixel circuit 500, the second pixel circuit 600 and the third pixel circuit 700 respectively corresponding to the first sub-pixel 110, the second sub-pixel 210 and the third sub-pixel 310 of a same color have a same circuit structure. In the embodiment, the first pixel circuit 500, the second pixel circuit 600 and the third pixel circuit 700 respectively corresponding to the first sub-pixel 110, the second sub-pixel 210 and the third sub-pixel 310 of a same color have a same circuit structure.

The circuit structure of the first pixel circuit 500 may be any of a 2T1C circuit, a 7T1C circuit, a 7T2C circuit or a 9T1C circuit. In the present application, the "2T1C circuit" refers to a pixel circuit including two transistors (T) and one capacitor (C), the same applies to the other "7T1C circuit", "7T2C circuit" and "9T1C circuit".

Optionally, all of the first pixel circuit 500, the second pixel circuit 600 and the third pixel circuit 700 include transistors and capacitors, and among the first pixel circuit 500, the second pixel circuit 600 and the third pixel circuit 700, the transistors with a same function have a same channel length and a same channel width, and the capacitors with a same function have a same capacitance value.

Optionally, the first pixel circuit 500 electrically connected with the first sub-pixel 110 includes a first switching transistor and a first driving transistor, the second pixel circuit 600 electrically connected with the second sub-pixel 210 of the same color as this first sub-pixel 110 includes a second switching transistor and a second driving transistor, and the third pixel circuit 700 electrically connected with the third sub-pixel 310 of the same color as this first sub-pixel 110 includes a third switching transistor and a third driving transistor. Herein, the channel lengths and the channel widths of the first switching transistor, the second switching transistor and the third switching transistor are respectively corresponding to and the same as each other; and the channel lengths and the channel widths of the first driving transistor, the second driving transistor and the third driving transistor are respectively corresponding to and the same as each other.

Optionally, a ratio of the channel width to the channel length of at least one of the transistors is 4:10. Optionally, a capacitance value of at least one of the capacitors is 80 femto Farad (fF) to 120 femto Farad.

Through configuring the first pixel circuit 500 electrically connected with the first sub-pixel 110, the second pixel circuit 600 electrically connected with the second sub-pixel 210 of a same color, and the third pixel circuit 700 electrically connected with the third sub-pixel 310 of the same color with the same structure and the same device parameter, the driving signals received by the first sub-pixel 110, the second sub-pixel 210 of the same color, and the third sub-pixel 310 of the same color also tend to be consistent, and the display uniformity of the first secondary display area SA1, the second secondary display area SA2 and the transition display area TA is further improved.

Optionally, the display panel 1000 may further include an encapsulation layer and a polarizer and a cover plate located on the encapsulation layer. The cover plate may also be directly arranged on the encapsulation layer without the polarizer, or at least the cover plate is directly arranged on the encapsulation layer in the first secondary display area SA1 without the polarizer, which prevents the polarizer from affecting the light collection amount of the photosensitive component correspondingly arranged under the first secondary display area SA1. The polarizer may also be arranged on the encapsulation layer in the first secondary display area SA1.

Embodiments of the present application further provide a display apparatus which may include the display panel 1000 of any of the above embodiments.

Figure 6:
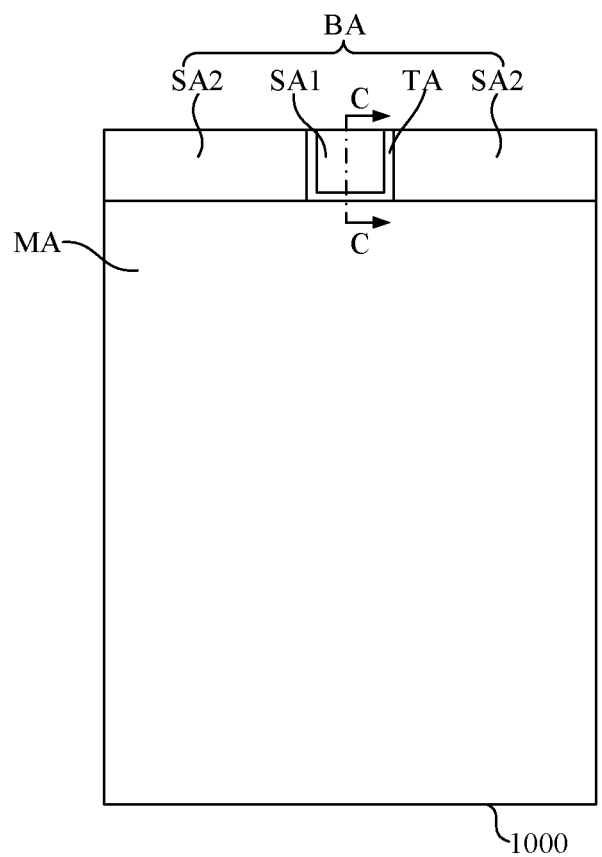
FIG. 6 is a top view of a display apparatus provided according to an embodiment of the present application.
Figure 7:
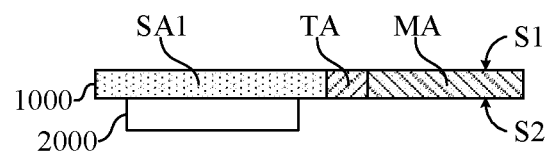
FIG. 7 is a cross-sectional view taken along the line C-C in FIG. 6.

FIG. 6 is a top view of a display apparatus provided according to an embodiment of the present application, and FIG. 7 is a cross-sectional view taken along the line C-C in FIG. 6. In the display apparatus of the embodiment, the display panel 1000 may be the display panel 1000 of one of the above embodiments. The display panel 1000 includes the main display area MA, the first secondary display area SA1, the second secondary display area SA2 and the transition display area TA. The first secondary display area SA1, the second secondary display area SA2 and the transition display area TA may be collectively reused as the status bar display area BA. The transmittance of the first secondary display area SA1 is greater than the transmittance of the main display area MA.

The display panel 1000 includes a first surface S1 and a second surface S2 opposing to each other, in which the first surface S1 is a display surface. The display apparatus further includes a photosensitive component 2000 located on the second surface S2 side of the display panel 1000, and the position of the photosensitive component 2000 corresponds to the position of the first secondary display area SA1.

The photosensitive component 2000 may be an image capturing component for capturing external image information. In the embodiment, the photosensitive component 2000 is a Complementary Metal Oxide Semiconductor (CMOS) image capturing component. Alternatively, the photosensitive component 2000 may also be other image capturing components such as a Charge-coupled Device (CCD) image capturing component. It may be appreciated that the photosensitive component 2000 may not be limited to an image capturing component. For example, the photosensitive component 2000 may also be an optical sensor, for example, an infrared sensor, a proximity sensor, and the like.

According to the display apparatus of embodiments of the present application, the transmittance of the first secondary display area SA1 is greater than the transmittance of the second secondary display area SA2, such that the photosensitive component 2000 may be integrated on the rear of the first secondary display area SA1 of the display panel 1000. An under-screen integration is achieved for the photosensitive component 2000 such as an image capturing component, and moreover, the first secondary display area SA1 can display the image, the display area of the display panel 1000 is increased and a full-screen design is achieved for the display apparatus.

At least two of the first sub-pixel 110, the second sub-pixel 210 and the third sub-pixel 310 of a same color have a same size, thus the display difference and the lifespan difference between at least two of the first secondary display area SA1, the second secondary display area SA2 and the transition display area TA is reduced, and the display uniformity of the display apparatus is improved.

What is claimed is:

1. A display panel comprising a main display area, a first secondary display area, a second secondary display area and a transition display area,
   wherein the first secondary display area, the second secondary display area and the transition display area are located at a same side of the main display area, the transition display area is located between the first secondary display area and the second secondary display area, a transmittance of the first secondary display area is greater than a transmittance of the main display area, and the display panel comprises:
   a first pixel unit located in the first secondary display area and comprising a first sub-pixel;

a first pixel circuit located in the transition display area, electronically connected with the first sub-pixel and configured to drive the first sub-pixel for display;

a second pixel unit located in the second secondary display area and comprising a second sub-pixel; and a third pixel unit located in the transition display area and comprising a third sub-pixel;

wherein at least two of the first sub-pixel, the second sub-pixel and the third sub-pixel of a first color have a first size;

the first sub-pixel comprises a first electrode, a first light-emitting structure located on the first electrode, and a second electrode located on the first light-emitting structure;

the second sub-pixel comprises a third electrode, a second light-emitting structure located on the third electrode, and a fourth electrode located on the second light-emitting structure;

the third sub-pixel comprises a fifth electrode, a third light-emitting structure located on the fifth electrode, and a sixth electrode located on the third light-emitting structure; and all of the first electrode, the third electrode and the fifth electrode are reflective electrodes.

2. The display panel of claim 1, wherein the first sub-pixel comprises a first light-emitting area and a first non-light-emitting area, the first non-light-emitting area is arranged around at least part of a periphery of the first light-emitting area, and a transmittance of the first non-light-emitting area is greater than a transmittance of the first light-emitting area;

the second sub-pixel comprises a second light-emitting area and a second non-light-emitting area, and the second non-light-emitting area is arranged around at least part of a periphery of the second light-emitting area;

the third sub-pixel comprises a third light-emitting area and a third non-light-emitting area, and the third non-light-emitting area is arranged around at least part of a periphery of the third light-emitting area;

the display panel further comprises a fourth pixel unit located in the main display area, the fourth pixel unit comprises a fourth sub-pixel, the fourth sub-pixel comprises a fourth light-emitting area and a fourth non-light-emitting area, and the fourth non-light-emitting area is arranged around at least part of a periphery of the fourth light-emitting area; and wherein sizes of at least two of the first light-emitting area corresponding to the first sub-pixel of the first color, the second light-emitting area corresponding to the second sub-pixel of the first color, and the third light-emitting area corresponding to the third sub-pixel of the first color are the same and smaller than a size of the fourth light-emitting area of the fourth sub-pixel of the first color.

3. The display panel of claim 2, wherein a ratio of a total area of the first light-emitting area in the first pixel unit to an area of the first pixel unit is in a range of 0.02 to 0.25.

4. The display panel of claim 3, wherein the ratio of the total area of the first light-emitting area in the first pixel unit to the area of the first pixel unit is in a range of 0.05 to 0.12; and the transmittance of the first secondary display area is greater than or equal to 15%.

5. The display panel of claim 1, wherein at least two of the first electrode, the third electrode and the fifth electrode respectively corresponding to the first sub-pixel, the second sub-pixel and the third sub-pixel of the first color have a same shape, a same size and a same layer structure.

6. The display panel of claim 1, wherein at least two of the first light-emitting structure, the second light-emitting structure and the third light-emitting structure respectively corresponding to the first sub-pixel, the second sub-pixel and the third sub-pixel of the first color have a same shape, a same size and a same layer structure.

7. The display panel of claim 1, wherein at least two of the second electrode, the fourth electrode and the sixth electrode respectively corresponding to the first sub-pixel, the second sub-pixel and the third sub-pixel of the first color have a same shape, a same size and a same layer structure.

8. The display panel of claim 1, wherein first electrodes of at least two adjacent first sub-pixels of the first color are interconnected to form a first interconnected electrode, third electrodes of at least two adjacent second sub-pixels of the first color are interconnected to form a second interconnected electrode, fifth electrodes of at least two adjacent third sub-pixels of the first color are interconnected to form a third interconnected electrode, and at least two of the first interconnected electrode, the second interconnected electrode and the third interconnected electrode respectively corresponding to the first sub-pixel, the second sub-pixel and the third sub-pixel of the first color have a same shape.

9. The display panel of claim 1, wherein the display panel comprises a substrate, an orthographic projection of the first electrode on the substrate consists of one first graphic unit or two or more first graphic units jointed together, and the first graphic unit comprises at least one selected from a group comprising a round shape, an oval shape, a dumb-bell shape, a gourd shape and a rectangle shape.

10. The display panel of claim 1, wherein the display panel comprises a substrate, an orthographic projection of the first light-emitting structure on the substrate consists of one second graphic unit or two or more second graphic units jointed together, and the second graphic unit comprises at least one selected from a group comprising a round shape, an oval shape, a dumb-bell shape, a gourd shape and a rectangle shape.

11. The display panel of claim 1, wherein at least two of the first pixel unit, the second pixel unit and the third pixel unit have a same arrangement rule.

12. The display panel of claim 1, wherein the display panel further comprises:

a second pixel circuit located in the second secondary display area, electronically connected with the second sub-pixel and configured to drive the second sub-pixel for display;

a third pixel circuit located in the transition display area, electronically connected with the third sub-pixel and configured to drive the third sub-pixel for display; and at least two of the first pixel circuit, the second pixel circuit and the third pixel circuit respectively corresponding to the first sub-pixel, the second sub-pixel and the third sub-pixel of the first color have a same circuit structure.

13. The display panel of claim 12, wherein all of the first pixel circuit, the second pixel circuit and the third pixel circuit comprise transistors and capacitors, and among the first pixel circuit, the second pixel circuit and the third pixel circuit, the transistors with a same function have a same channel length and a same channel width, and the capacitors with a same function have a same capacitance value.

14. The display panel of claim 13, wherein a ratio of a channel width to a channel length of at least one of the transistors is 4:10; and
    a capacitance value of at least one of the capacitors is 80 femto Farad to 120 femto Farad.

15. The display panel of claim 1, wherein a circuit structure of the first pixel circuit is any one of a circuit with two transistors and one capacitor, a circuit with seven transistors and one capacitor, a circuit with seven transistors and two capacitors or a circuit with nine transistors and one capacitor; or
    the first secondary display area, the second secondary display area and the transition display area are collectively reused as a status bar display area, the status bar display area is arranged adjacent to the main display area in a first direction, the status bar display area is in a strip shape extending along a second direction, and the second direction intersects the first direction.

16. A display panel comprising a main display area, a first secondary display area, a second secondary display area and a transition display area,
    wherein the first secondary display area, the second secondary display area and the transition display area are located at a same side of the main display area, the transition display area is located between the first secondary display area and the second secondary display area, a transmittance of the first secondary display area is greater than a transmittance of the main display area, and the display panel comprises:
  a first pixel unit located in the first secondary display area and comprising a first sub-pixel;
  a first pixel circuit electronically connected with the first sub-pixel and configured to drive the first sub-pixel for display;
  a second pixel unit located in the second secondary display area and comprising a second sub-pixel; and
  a third pixel unit located in the transition display area and comprising a third sub-pixel;
    wherein at least two of the first sub-pixel, the second sub-pixel and the third sub-pixel of a first color have a first size;
    the first sub-pixel comprises a first electrode, a first light-emitting structure located on the first electrode, and a second electrode located on the first light-emitting structure;
    the second sub-pixel comprises a third electrode, a second light-emitting structure located on the third electrode, and a fourth electrode located on the second light-emitting structure;
    the third sub-pixel comprises a fifth electrode, a third light-emitting structure located on the fifth electrode, and a sixth electrode located on the third light-emitting structure; and
    all of the first electrode, the third electrode and the fifth electrode are reflective electrodes.

17. The display panel of claim 16, wherein the first sub-pixel comprises a first light-emitting area and a first non-light-emitting area, the first non-light-emitting area is arranged around at least part of a periphery of the first light-emitting area;
    the second sub-pixel comprises a second light-emitting area and a second non-light-emitting area, and the second non-light-emitting area is arranged around at least part of a periphery of the second light-emitting area;
    the third sub-pixel comprises a third light-emitting area and a third non-light-emitting area, and the third non-light-emitting area is arranged around at least part of a periphery of the third light-emitting area;
    the display panel further comprises a fourth pixel unit located in the main display area, the fourth pixel unit comprises a fourth sub-pixel, the fourth sub-pixel comprises a fourth light-emitting area and a fourth non-light-emitting area, and the fourth non-light-emitting area is arranged around at least part of a periphery of the fourth light-emitting area; and
    wherein sizes of at least two of the first light-emitting area corresponding to the first sub-pixel of the first color, the second light-emitting area corresponding to the second sub-pixel of the first color, and the third light-emitting area corresponding to the third sub-pixel of the first color are the same.

18. The display panel of claim 16, wherein the display panel further comprises:
  a second pixel circuit electronically connected with the second sub-pixel and configured to drive the second sub-pixel for display;
  a third pixel circuit located in the transition display area, electronically connected with the third sub-pixel and configured to drive the third sub-pixel for display; and
  at least two of the first pixel circuit, the second pixel circuit and the third pixel circuit respectively corresponding to the first sub-pixel, the second sub-pixel and the third sub-pixel of the first color have a same circuit structure.

19. The display panel of claim 16, wherein at least two of the first pixel unit, the second pixel unit and the third pixel unit have a same arrangement rule.

20. The display panel of claim 16, wherein the transmittance of the first secondary display area is greater than a transmittance of the transition display area, the first sub-pixel and the third sub-pixel of a first color have a same size;
    the transmittance of the first secondary display area is greater than a transmittance of the second secondary display area;
  a pixel unit density of the third pixel unit and a pixel unit density of the first pixel unit are equal to each other, a size of the first sub-pixel is greater than a size of the fourth sub-pixel, and a density of the first sub-pixel in at least part of the first secondary display area is less than a density of the fourth sub-pixel in at least part of the main display area.

\* \* \* \* \*